(12) United States Patent
Tsorng et al.

(10) Patent No.: US 11,627,680 B2
(45) Date of Patent: Apr. 11, 2023

(54) TOP COVER SYSTEM FOR A COMPUTER CHASSIS

(71) Applicant: QUANTA COMPUTER INC., Taoyuan (TW)

(72) Inventors: Yaw-Tzorng Tsorng, Taoyuan (TW); Tung-Hsien Wu, Taoyuan (TW); Chih-Hsiung Tsai, Taoyuan (TW); Yu-Ying Tseng, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 45 days.

(21) Appl. No.: 17/325,076

(22) Filed: May 19, 2021

(65) Prior Publication Data

US 2022/0377923 A1 Nov. 24, 2022

(51) Int. Cl.
*H05K 7/14* (2006.01)

(52) U.S. Cl.
CPC ......... *H05K 7/1418* (2013.01); *H05K 7/1489* (2013.01)

(58) Field of Classification Search
CPC combination set(s) only.
See application file for complete search history.

(56) References Cited

U.S. PATENT DOCUMENTS

| | | | |
|---|---|---|---|
| 8,705,241 B2* | 4/2014 | Lin | G06F 1/1658 |
| | | | 361/756 |
| 10,863,644 B1* | 12/2020 | Tseng | H05K 7/1487 |
| 2010/0143794 A1* | 6/2010 | Li | H01M 50/209 |
| | | | 429/163 |
| 2021/0068317 A1* | 3/2021 | Wang | H05K 9/0007 |
| 2021/0385958 A1* | 12/2021 | Yu | H05K 7/1417 |

* cited by examiner

*Primary Examiner* — Hung S. Bui
(74) *Attorney, Agent, or Firm* — Nixon Peabody LLP

(57) ABSTRACT

A chassis for a computing device includes a base component and a top cover. The base component includes guide slots therein. The top cover includes stamped protrusions extending from one or more side slider structures. The slider structurers extend downwardly from a top surface of the top cover. The stamped protrusions are unitary one-piece structures with the one or more side slider structures. The stamped protrusions correspond to respective guide slots of the base component such that the stamped protrusions are positioned in corresponding guide slots when the base component and the top cover are in a mating position.

14 Claims, 6 Drawing Sheets

TOP COVER SYSTEM FOR A COMPUTER CHASSIS

FIELD OF THE INVENTION

The present invention relates generally to a slider system, and more specifically to a top cover slider system for a computer chassis.

BACKGROUND OF THE INVENTION

Computing systems, such as servers, include chassis that encloses components of a computing device. The chassis can be constructed in an automated assembly fashion, which provides a cheap and efficient method of manufacturing computing devices. Top covers typically include guide pins riveted to sheet metal where the rivets engage with a guide hole along the side of a base component of the chassis. As the size of the chassis increases, additional guide pins are needed to secure the top cover to the base component, which increases fabrication complexities.

Accordingly, there is a need for improved mechanisms for securing a top cover to a base component of a computer chassis.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a chassis for a computing device comprises a base component including guide slots therein, and a top cover including stamped protrusions extending from one or more side slider structures. The one or more side slider structurers extend downwardly from a top surface of the top cover. The stamped protrusions are unitary one-piece structures with the one or more side slider structures. The stamped protrusions correspond to respective guide slots of the base component such that the stamped protrusions are positioned in corresponding guide slots when the base component and the top cover are in a mating position.

In a further aspect of the implementation, the stamped protrusions each define a hollow interior space. In a further aspect, the stamped protrusions are generally cylindrical. In a further aspect, the stamped protrusions have a generally hemispherical closed end extending from the one or more side slider structures. In a further aspect, the stamped protrusions have a rounded edge at a closed end that extends from the one or more side slider structures. In a further aspect, the stamped protrusions have a generally frustoconical shape. In a further aspect, the stamped protrusions have a campanulate shape. In yet a further aspect, the stamped protrusions are embossed into the one or more side slider structures of the top cover.

In a further aspect of the implementation, at least one of the stamped protrusions protrudes from a bottom third portion along a height of the one or more side slider structures. In a further aspect, the at least one of the stamped protrusions abuts a lower edge of the one or more side slider structures. In a further aspect, the at least one of the stamped protrusions defines a portion of the lower edge of the one or more side slider structures. In yet a further aspect, the at least one of the stamped protrusions includes a cylindrical main body having an outside radius. The at least one of the stamped protrusions is positioned a distance of less than 1.5 times the outside radius from the lower edge of the side slider structure.

According to certain aspects of the present disclosure, a top cover for a chassis comprises one or more side slider structures extending downwardly from corresponding edges of a top structure, and stamped protrusions extending from the one or more side slider structures. The stamped protrusions are unitary one-piece structures with the one or more side slider structures.

In a further aspect of the implementation, the stamped protrusions each define a hollow interior space. In a further aspect, at least one of the stamped protrusions has a rounded edge at a closed end that extends away from at least one of the one or more side slider structures. In a further aspect, the stamped protrusions are embossed into the one or more side slider structures. In a further aspect, at least one of the stamped protrusions protrudes from the bottom third portion along a height of the one or more side slider structures. In a further aspect, the at least one of the stamped protrusions abuts a lower edge of the one or more side slider structures. In a further aspect, the at least one of the stamped protrusions defines a portion of the lower edge of the one or more side slider structures. In yet a further aspect, the at least one of the stamped protrusions includes a cylindrical main body having an outside radius. The at least one of the stamped protrusions being positioned a distance of less than 1.5 times the outside radius from the lower edge of the side slider structure.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The present disclosure, and its advantages, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1A:
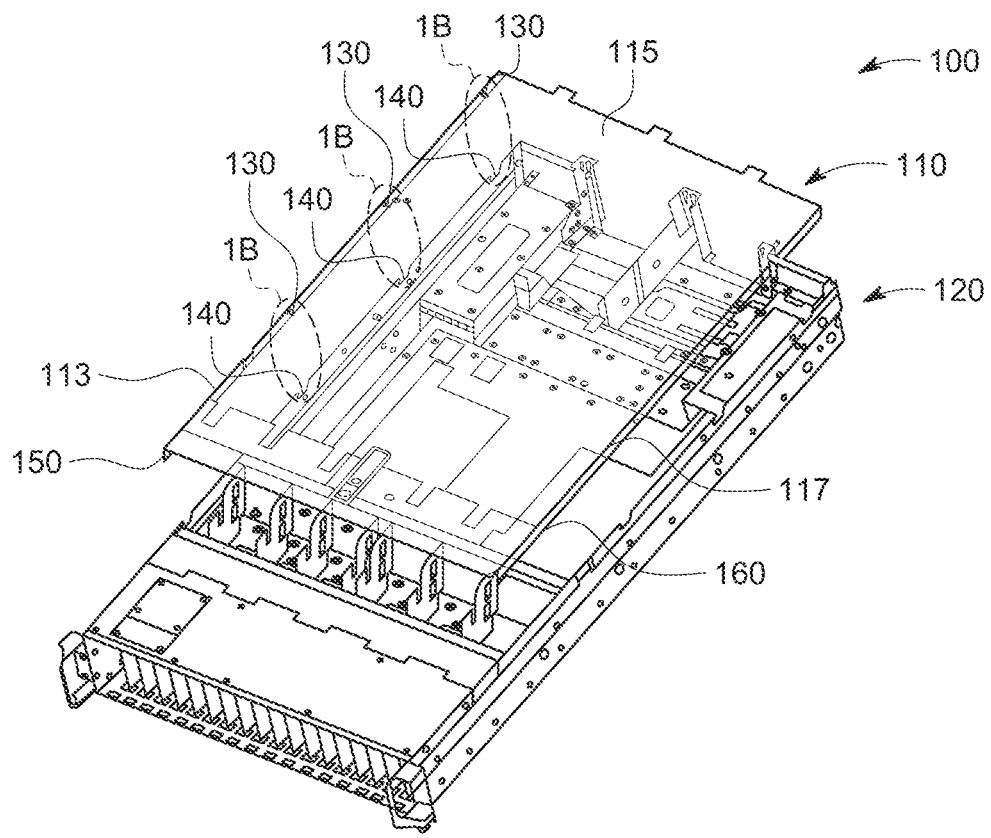
FIGS. 1A-1B are top perspective and side views of a top cover and a base component of a computer chassis including stamped protrusions for engaging with corresponding guide slots of the base component, according to some implementations of the present disclosure.

A chassis for a computing device is described that includes a base component and a top cover. The top cover includes stamped protrusions extending from one or more side slider structures and engaging with guide slots in the base component. The side slider structurers extend downwardly from a top surface of the top cover. The stamped protrusions are unitary one-piece structures with the one or more side slider structures. Each of the stamped protrusions further correspond to respective guide slots such that the stamped protrusions are positioned within corresponding guide slots when the base component and the top cover are in a mating position.

The top cover system for a computer chassis described by the present disclosure has improved strength, and is more streamlined, than traditional guide pin configurations for securing a top cover to a base component. For example, the present disclosure of stamped protrusions that extend from side slider structures of a top cover has a higher-strength than traditional guide pins because the stamped protrusion are formed into the same material (e.g., sheet metal) used to form the side slider structures, rather than being a separate component that is mechanically connected to the top cover system. The high-strength configuration using stamped protrusions means that the desired securing of the top cover to the base component of a chassis can be achieved with, for example, fewer stamped protrusions than would otherwise be needed for a top cover using traditional riveted guide pins. Furthermore, stamp protrusions allow flexibility on the positioning of the stamped protrusions on the side slider structure. For example, where a traditional riveted guide pin would typically fail, such as at or near an edge of the side slider structure, a stamped protrusion in a side slider structure of a top cover would have sufficient operating strength over the working life of the computing device.

Fabrication of stamped protrusions in a side slider structure of a top cover can occur using stamping or pressing techniques on, for example, a flat sheet of metal that forms the side slider structure. A stamping press with a tool and die surface can be used to form the metal into the desired stamped protrusion shape, such as the shapes depicted and described in more detail below in the context of FIGS. 1-6.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

For the present disclosure, the terms "computer system" or "computing device" or "computing system" refer to any electronically-powered or battery-powered equipment that has hardware, software, and/or firmware components, where the software and/or firmware components can be configured, for operating features on the device.

Figure 1B:
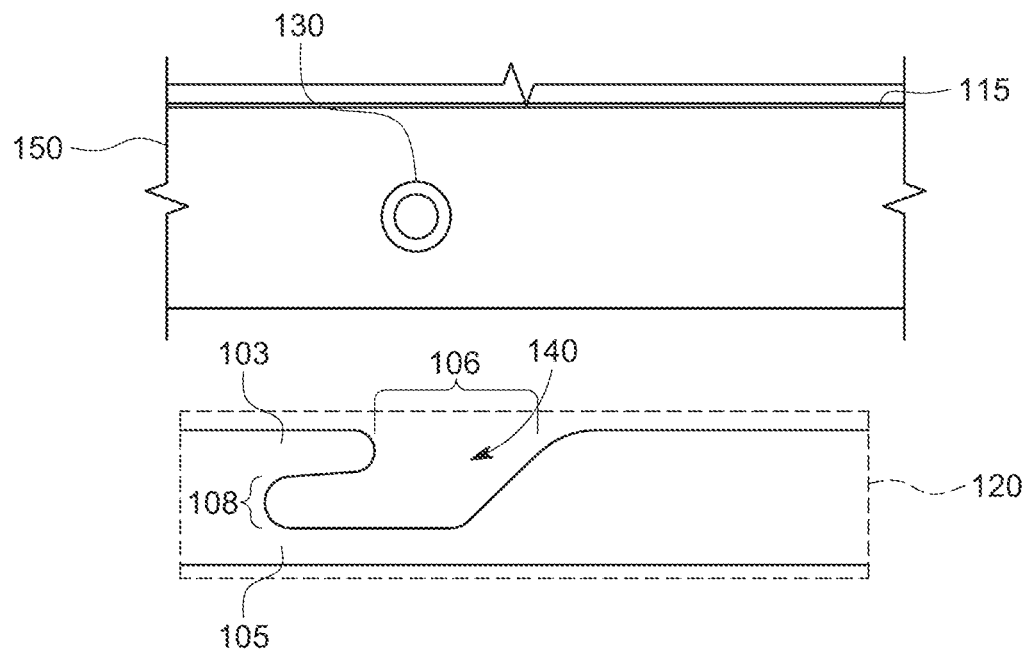

Turning now to FIGS. 1A-1B, a top perspective view and a side view of a top cover 110 and a base component 120 of a computer chassis 100 are depicted. The computer chassis 100 is for a computing device that can include a base component 120 including guide slots 140 and a top cover 110 including stamped protrusions 130 extending from one or more side slider structures 150, 160. The side slider structurers 150, 160 can extend downwardly from opposing edges 113, 117 of a top structure 115 of the top cover 110. The stamped protrusions 130 are unitary one-piece structures with their respective side slider structures 150, 160. Each of the stamped protrusions 130 further corresponds to one of the guide slots 140. In some implementations, the stamped protrusions 130 can be embossed into a metal material, such as, but not limited to, sheet metal used to fabricate the side slider structures 150, 160 of the top cover 110.

The guide slots 140 can have an upper wall 103, a lower wall 105, an opening portion 106, and an end portion 108. The guide slots 140 can be located along the exterior of opposing sides of the base component 120, in order to provide a plurality of locations for a top cover 110 to be linked or mated to the base component 120. Although three guide slots 140 are shown in FIG. 1A along each opposing side of the base component 120, a base component can include any number of guide slots 140 needed to secure a top cover.

During the process of linking or mating the top cover 110 to the base component 120, the stamped protrusions 130 slide between an upper wall 103 and a lower wall 105 of the guide slots 140. The guide slot 140 has an opening portion 106, where the stamped protrusion 130 enters, and an end portion 108, where the stamped protrusion 130 comes to rest and cannot be slid further into the guide slot 140. In some implementations, the end portion 108 can have a width that is approximately the same as a diameter of a stamped protrusion 130. The guide slot 140 can, in some implementations, be tapered between the opening portion 106 and the end portion 108, such that the guide slot 140 eventually reaches a smaller diameter than a diameter of a stamped protrusion 130. This point can be referred to as a hard stop because the stamped protrusion 130 can go no further into the guide slot 140.

Figure 2A:
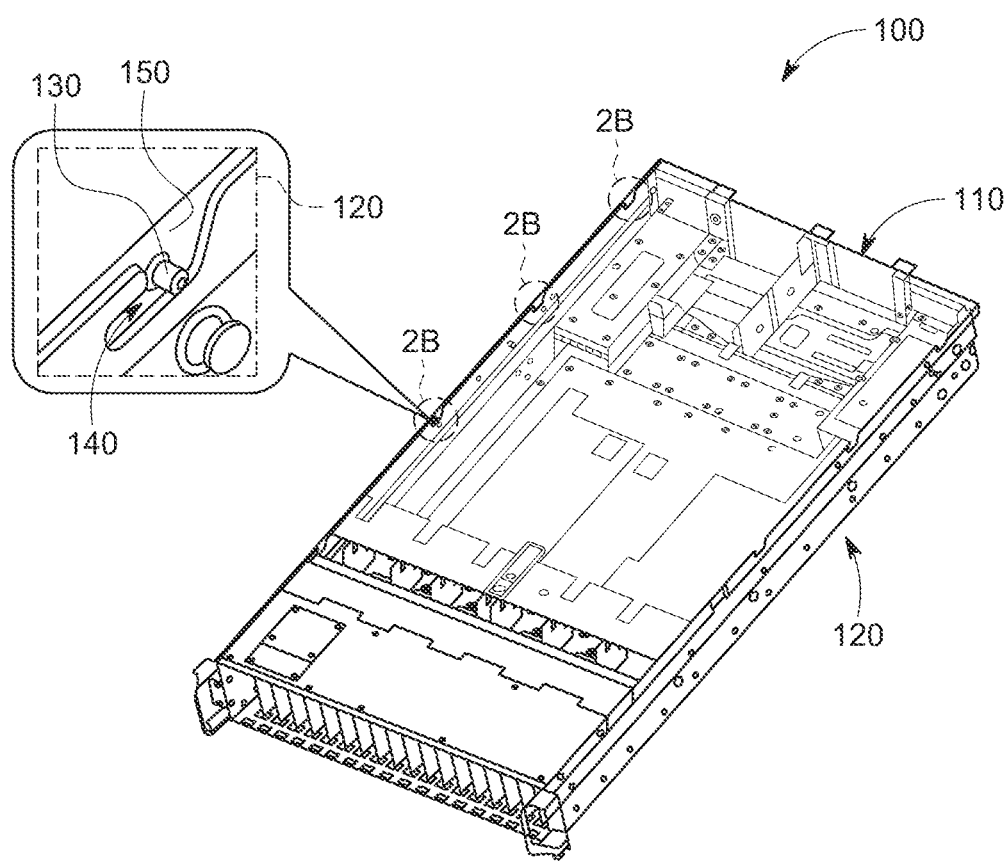
FIGS. 2A-2B are top perspective and side views of the top cover and the base component for the computer chassis of FIG. 1, with the stamped protrusion within the guide slot of the base component, according to some implementations of the present disclosure.
Figure 2B:
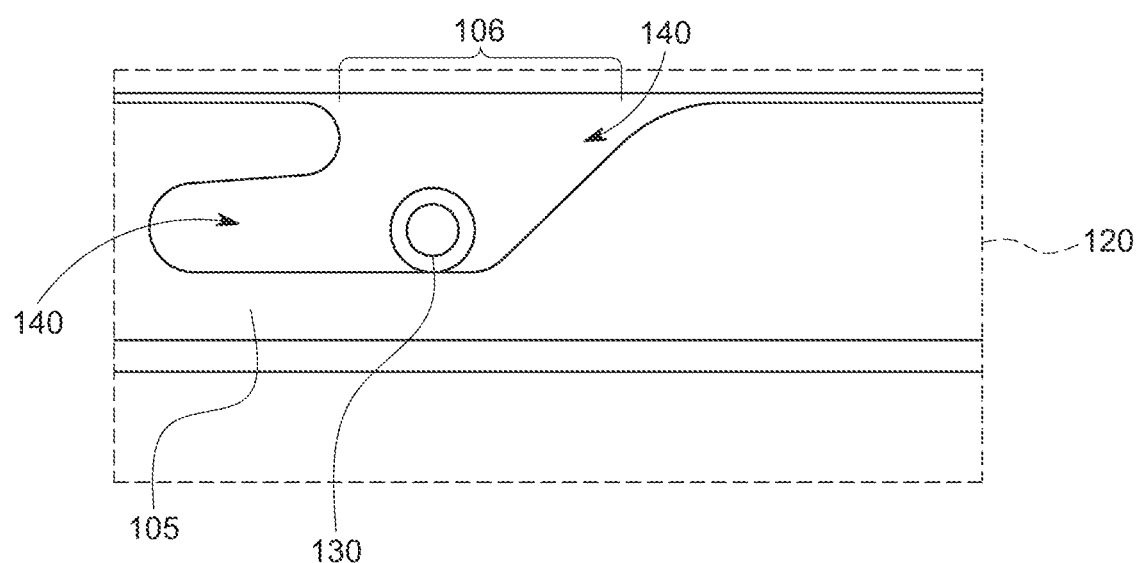

Referring to FIGS. 2A-2B, a top perspective view and a side view of the top cover 110 and the base component 120 for the computer chassis 100 of FIG. 1 are depicted with the stamped protrusions 130 within the guide slots 140 of the base component 120, after entering the open portions 106. The top cover 110 is manually placed onto the base component 120, where the stamped protrusions 130 engage with corresponding guide slots 140 of the base component 120. As depicted in FIG. 2B, the stamped protrusion 130 is in an intermediate position in the guide slot 140 and resting on the lower wall 105.

Figure 3A:
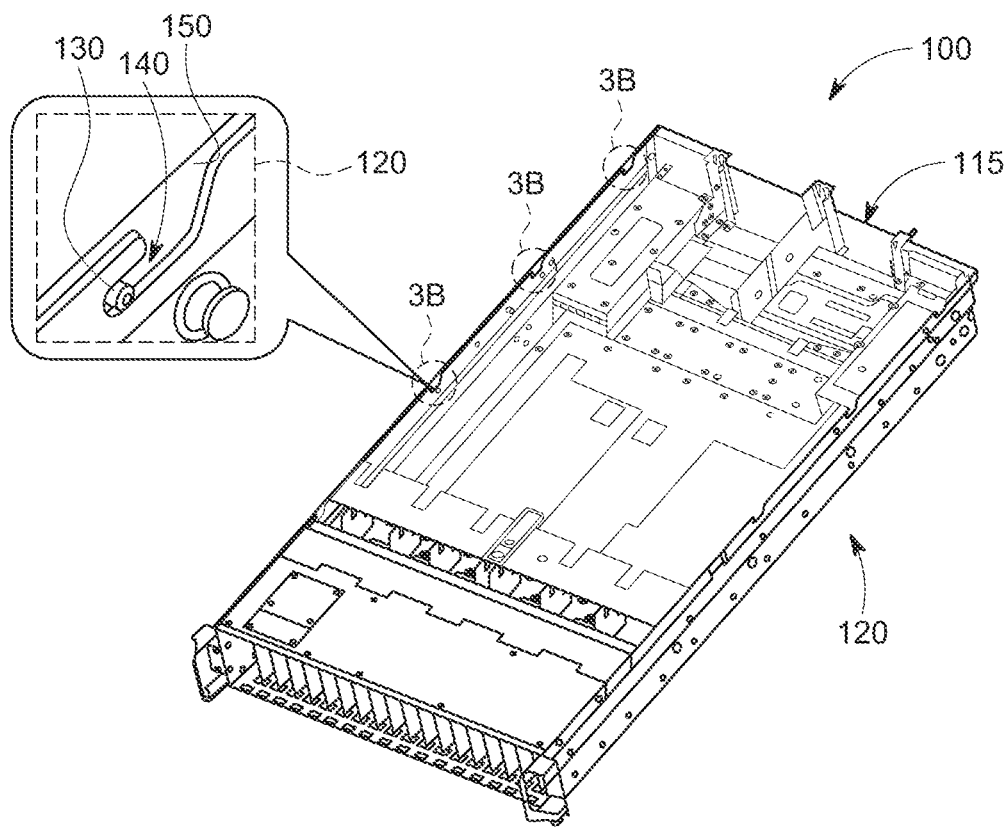
FIGS. 3A-3B are top perspective and side views of the top cover and the base component for the computer chassis of FIG. 1, with the stamped protrusion fully engaged with the base component, according to some implementations of the present disclosure.
Figure 3B:
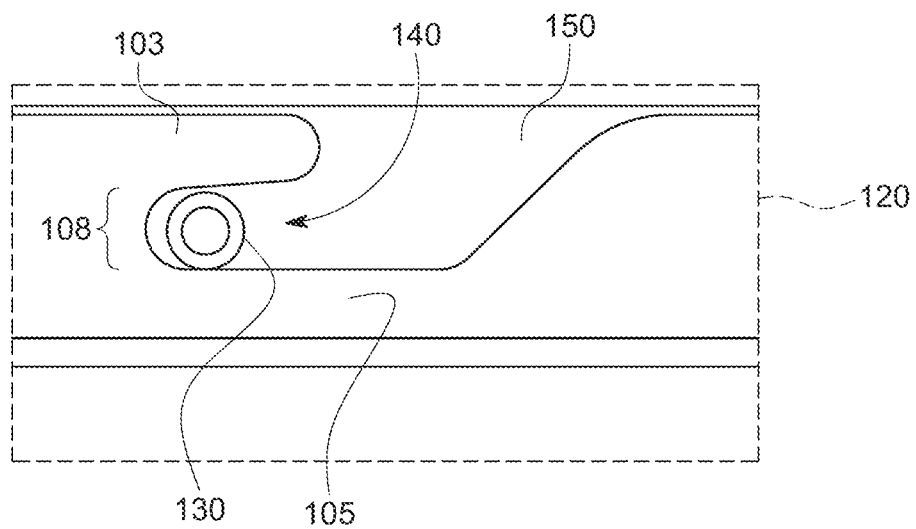

Referring now to FIGS. 3A-3B, a top perspective view and a side view of the top cover 110 and the base component 120 for the computer chassis of FIG. 1 are depicted. After being placed in the intermediate position as depicted in FIGS. 2A-2B, the top cover 110 is manually urged further into the guide slots 140 of the base component 120 before the stamped protrusions 130 cause the top cover 110 to come to rest due to the hard stop at end portion 108. The connection between the stamped protrusions 130 of the top cover 110 with the upper wall 103 and/or lower wall 105 at the end portion 108 of the guide slots 140 of the base component 120 can be referred to as a mating position. In the mating position, the stamped protrusions 130 of the top cover 110 can be considered fully engaged with the base component 120.

Referring now to FIGS. 4A-4E, different perspective views of various exemplary stamped protrusions 430a-430e with corresponding side slider structures 450a-450e are depicted. The stamped protrusions 430a-430e each define a hollow interior space, such as hollow interior spaces 440d, 440e.

The stamped protrusions 430a-430c are effectively a metal shell stamped or pressed into the metal of side slider structures 450a-450c, and include closed ends 437a-437c on one side and an open end (not shown) on the other side that provides access to the hollow interior space (not shown) defined by the metal shell. In some implementations, the stamped protrusion 430a may be positioned centrally on the side slider structure 450a, about halfway between a top edge 451a and a bottom edge 452a. In some implementations, the stamped protrusion 430b may be positioned very close to a lower edge 452b of the side slider structure 450b. For example, the stamped protrusion 450b may be positioned in the lower half (e.g., stamped protrusion 430c) or lower third (e.g., stamped protrusion 450b) along the height of their respective side slider structures (e.g., side slider structure 450c, 450b).

At least a portion of the stamped protrusions 430a-430c can have a generally cylindrical main body 435a-435c. The generally cylindrical main bodies 435a-435c may have protrusions of varying heights from their corresponding side slider structure 450a-450c. For example, the generally cylindrical main body 435c has a protrusion of greater height from the side sliding surface 450c than that of the generally cylindrical main bodies 435a, 435b from the corresponding side slider structures 450a, 450b. In some implementations, the stamped protrusions 430a-430c may further have a generally hemispherical closed end 437a-437c extending from the generally cylindrical main body 435a-435c for engaging with a corresponding guide slot in the base component 120 (e.g., see guide slot 140 in FIGS. 1B, 2B, and 3B). In some implementations, the stamped protrusions 430a-430c can have a rounded edge 438a-438c at the closed end 437a-437c. In some implementations, a stamped protrusion has a generally frustoconical shape or a campanulate shape.

In some implementations, the stamped protrusions 430d, 430e can abut and/or define lower edges 452d, 452e of corresponding side slider structures 450d, 450e. The stamped protrusions 430d, 430e are initially stamped or pressed into the metal of the side slider structure 450d, 450e. The stamped protrusions 452d, 452e are then cut to create a half-shell shape with, for example, an open bottom 441d, 441e and an open side 442d, 442e that expose the respective hollow interior spaces 440d, 440e of the stamped protrusions 430d, 430e. The shape of stamped protrusion 430d is similar to the shape of stamped protrusion 430c, except that the stamped protrusion 430d is a half-shell (e.g., generally a half-cylinder with a half-hemispherical end). The shape of stamped protrusion 430e generally has a half-domed stadium shape.

Figure 5:
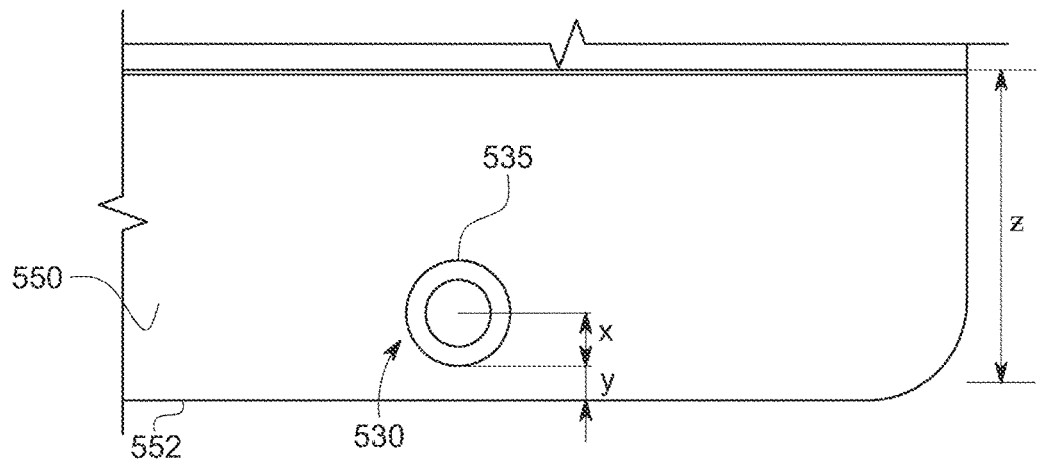
FIG. 5 is a side view of a stamped protrusion relative to a lower edge of a side slider structure, according to some implementations of the present disclosure.

Referring now to FIG. 5, a side view of a side slider structure 550 with a stamped protrusion 530 is depicted showing a relationship of the stamped protrusion 530 with a lower edge 552 and an overall height, z, of the side slider structure 550. The stamped protrusion 530 is a unitary one-piece structure with the side slider structure 550 and is entirely positioned in the lower half portion along the height of the side slider structure 550. The stamped protrusion 530 includes a cylindrical main body 535 having an outside radius, r, where a lower exterior surface of the cylindrical main body 535 is positioned at a distance, y, from the lower edge 552 of the side slider structure 550.

Figure 4A:
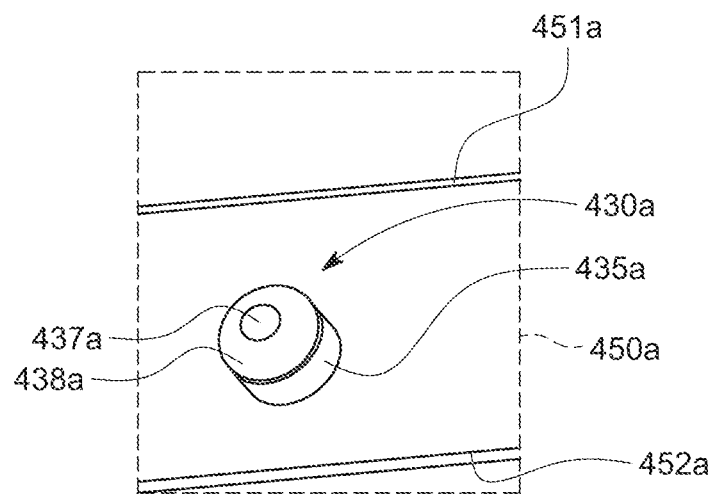
FIGS. 4A-4E are perspective views of various exemplary embodiments of stamped protrusions on a side slider structure, according to some implementations of the present disclosure.
Figure 4B:
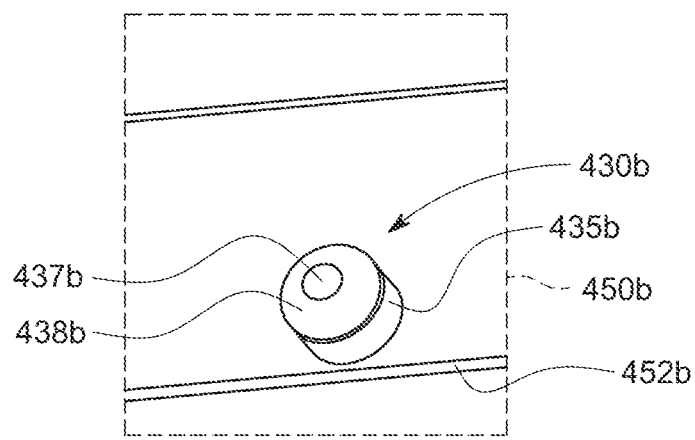
Figure 4C:
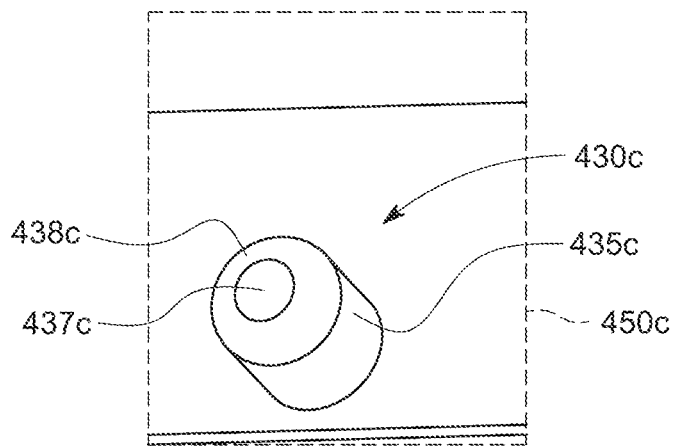
Figure 4D:
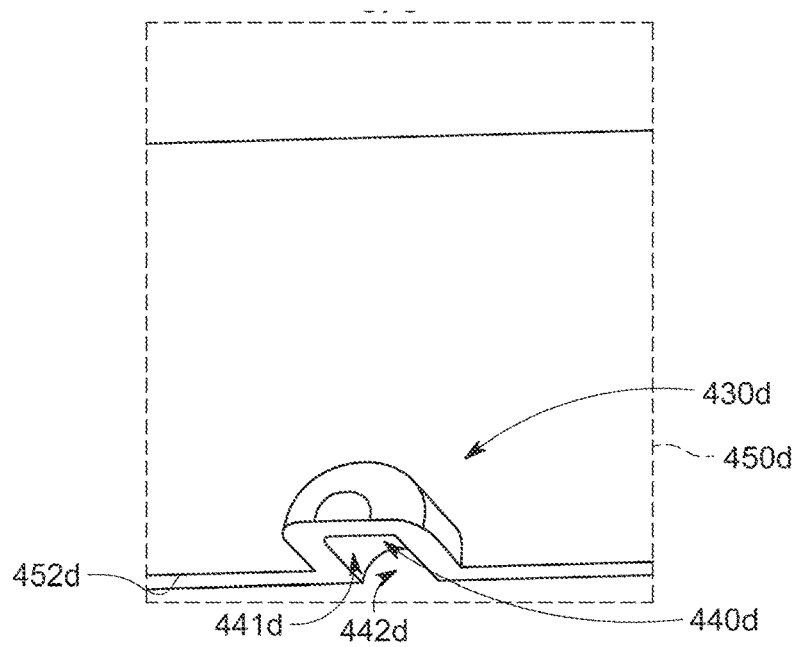
Figure 4E:
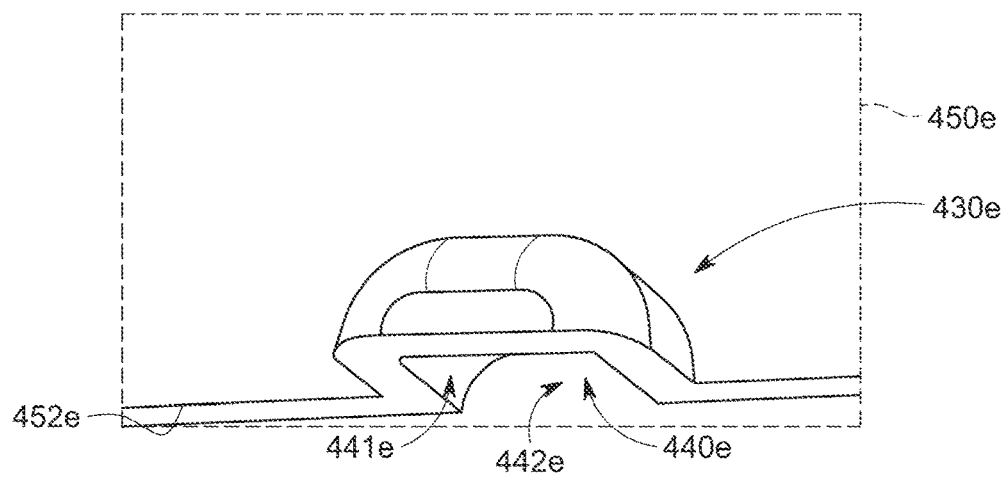

A desirable aspect of the present technology is that stamped protrusions, such as the stamped protrusion 530, of a top cover system, can be arranged at a distance of less than 1.5 times the outside radius, r, from the lower edge 552 of the side slider structure 550. With this arrangement, the stamped protrusions still provide sufficient strength to maintain the mating position between the top cover system and the base component of a computer chassis. As depicted in FIGS. 4A-4E, in some implementations, at least one of the stamped protrusions 530 protrudes from a bottom third portion along the height, z, of the side slider structures 550. In a further implementation, a stamped protrusion can be immediately adjacent (see FIG. 4B) to a lower edge 552 of the side slider structures 550. In a further implementation, a stamped protrusion can define a portion of the lower edge 552 of the slider structure 550 as depicted in FIGS. 4D and 4E.

Figure 6:
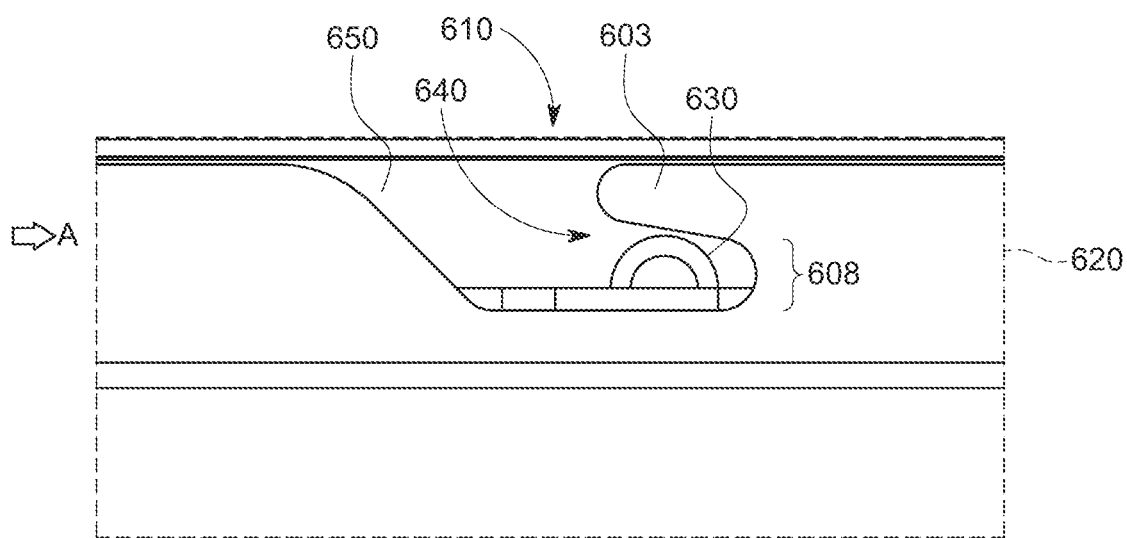
FIG. 6 is a side view of an exemplary stamped protrusion within a guide slot that engages with a base component of a computer chassis, according to some implementations of the present disclosure.

Referring to FIG. 6, a side view of another exemplary stamped protrusion 630 is depicted within a guide slot 640 to engage with a base component 620 of a computer chassis. The stamped protrusion 630 has a similar half-shell shape as stamped protrusions 430d, 430e depicted in FIGS. 4D and 4E. The stamped protrusion 630 is depicted after being in an intermediate position (e.g., similar to FIGS. 2A-2B for stamped protrusion 130) within the guide slot 640 and manually urged in direction A further into the guide slot 640 of the base component 620. The stamped protrusion 630 causes the top cover 610 to come to a hard stop at end portion 608 of the guide slot 640 when the stamped protrusion 630 comes into contact with an upper wall 603. The connection between the stamped protrusion 630 of the top cover 610 with the upper wall 603 at the end portion 608 of the guide slot 640 of the base component 620 is referred to as a mating position, similar to the mating position described for FIG. 3B. In the mating position of FIG. 6, the stamped protrusion 630 of the top cover 610 can be considered fully engaged with the base component 620.

The implementations described above for FIGS. 1 to 6 are primarily in the context of a top cover for a computer chassis being secured to the chassis of a computing device. However, the described system with an emboss engaging with the base component is applicable to other chassis, sub-chassis, or housing implementations for a computing device. The described top cover and emboss system and method for securing a top cover to a computer chassis have been presented by way of example only, and not limitation, and can include different combinations of the described elements.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A chassis for a computing device comprising:
   a base component including guide slots therein; and
   a top cover comprising stamped protrusions extending from one or more side slider structures, the one or more side slider structurers extending downwardly from a top surface of the top cover, the stamped protrusions being unitary one-piece structures with the one or more side slider structures,
   wherein the stamped protrusions correspond to respective guide slots of the base component such that the stamped protrusions are positioned in corresponding guide slots when the base component and the top cover are in a mating position;
   wherein at least one of the stamped protrusions defines a lower edge of the one or more side slider structures the at least one of the stamped protrusions including a cylindrical main body having an outside radius and being positioned a distance of less than 1.5 times the outside radius from the lower edge of the one or more side slider structures.

2. The chassis of claim 1, wherein the stamped protrusions each define a hollow interior space.

3. The chassis of claim 1, wherein the stamped protrusions are generally cylindrical.

4. The chassis of claim 3, wherein the stamped protrusions have a generally hemispherical closed end extending from the one or more side slider structures.

5. The chassis of claim 1, wherein the stamped protrusions have a rounded edge at a closed end that extends from the one or more side slider structures.

6. The chassis of claim 1, wherein the stamped protrusions have a generally frustoconical shape.

7. The chassis of claim 1, wherein the stamped protrusions have a campanulate shape.

8. The chassis of claim 1, wherein the stamped protrusions are embossed into the one or more side slider structures of the top cover.

9. A top cover for a chassis comprising:
   one or more side slider structures extending downwardly from corresponding edges of a top structure; and
   stamped protrusions extending from the one or more side slider structures, the stamped protrusions being unitary one-piece structures with the one or more side slider structures;
   wherein at least one of the stamped protrusions defines a portion of the lower edge of the one or more side slider structures, the at least one of the stamped protrusions including a cylindrical main body having an outside radius and being positioned a distance of less than 1.5 times the outside radius from the lower edge of the one or more side slider structures.

10. The top cover of claim 9, wherein the stamped protrusions each define a hollow interior space.

11. The top cover of claim 9, wherein at least one of the stamped protrusions has a rounded edge at a closed end that extends away from at least one of the one or more side slider structures.

12. The top cover of claim 9, wherein the stamped protrusions are embossed into the one or more side slider structures.

13. The top cover of claim 9, wherein at least one of the stamped protrusions protrudes from the bottom third portion along a height of the one or more side slider structures.

14. The top cover of claim 13, wherein the at least one of the stamped protrusions abuts a lower edge of the one or more side slider structures.

* * * * *